US 11,300,633 B2

(12) United States Patent
Rocher et al.

(10) Patent No.: US 11,300,633 B2
(45) Date of Patent: Apr. 12, 2022

(54) DEVICE FOR PROTECTING AN ELECTRONIC COMPUTER AGAINST A SHORT CIRCUIT

(71) Applicants: Continental Automotive France, Toulousee (FR); Continental Automotive GmbH, Hannover (DE)

(72) Inventors: Jacques Rocher, Saint Orens de Gameville (FR); Yannick Leroy, Saint Sulpice la Pointe (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 336 days.

(21) Appl. No.: 16/341,987

(22) PCT Filed: Nov. 16, 2017

(86) PCT No.: PCT/FR2017/053138
§ 371 (c)(1),
(2) Date: Apr. 15, 2019

(87) PCT Pub. No.: WO2018/091830
PCT Pub. Date: May 24, 2018

(65) Prior Publication Data
US 2019/0252872 A1 Aug. 15, 2019

(30) Foreign Application Priority Data
Nov. 18, 2016 (FR) ........................................ 1661186

(51) Int. Cl.
*H02H 3/24* (2006.01)
*G01R 31/52* (2020.01)
(Continued)

(52) U.S. Cl.
CPC .............. *G01R 31/52* (2020.01); *G06F 1/266* (2013.01); *G06F 11/3013* (2013.01);
(Continued)

(58) Field of Classification Search
CPC ...... H02H 1/0007; H02H 3/243; H02H 3/087; H02H 3/08; H02H 3/24; G06F 11/3013;
(Continued)

(56) References Cited

U.S. PATENT DOCUMENTS 5,491,601 A * 2/1996 Arntz .................... H02H 3/087
361/79
5,914,545 A * 6/1999 Pollersbeck ....... H03K 17/0822
307/131
(Continued)

FOREIGN PATENT DOCUMENTS

CN 102035165 A 4/2011
CN 103339727 A 10/2013
(Continued)

OTHER PUBLICATIONS

International Search Report and Written Opinion for International Application No. PCT/FR2017/053138, dated Mar. 21, 2018—7 pages.
(Continued)

*Primary Examiner* — Bryan R Perez
(74) *Attorney, Agent, or Firm* — RatnerPrestia

(57) ABSTRACT

A device for protecting an electronic computer against a short circuit. The electronic computer including a shunt resistor, a first computer pin and being coupled to at least one sensor comprising a first sensor pin and a second sensor pin. Furthermore including a transistor driving module having a first driving pin coupled to a first shunt pin, a second driving pin coupled to a positive power supply, a second shunt pin being coupled firstly to a first sensor pin and
(Continued)

secondly to a first comparator pin of a comparator module and designed to no longer supply electric power to the sensor through the first sensor pin when a short circuit is detected at the sensor.

8 Claims, 3 Drawing Sheets

(51) Int. Cl.
| | |
|---|---|
| *G06F 11/30* | (2006.01) |
| *H02H 3/087* | (2006.01) |
| *H02H 1/00* | (2006.01) |
| *G06F 1/26* | (2006.01) |
| *H04L 12/46* | (2006.01) |
| *H02H 3/08* | (2006.01) |
| *H04L 12/40* | (2006.01) |
| *G01R 31/28* | (2006.01) |
| *G01D 3/08* | (2006.01) |
| *G01R 1/20* | (2006.01) |

(52) U.S. Cl.
CPC ....... *G06F 11/3089* (2013.01); *H02H 1/0007* (2013.01); *H02H 3/08* (2013.01); *H02H 3/087* (2013.01); *H02H 3/24* (2013.01); *H02H 3/243* (2013.01); *H04L 12/4625* (2013.01); *G01D 3/08* (2013.01); *G01R 1/203* (2013.01); *G01R 31/2829* (2013.01); *G06F 11/3058* (2013.01); *H04L 12/40006* (2013.01)

(58) Field of Classification Search
CPC .. G06F 11/3089; G06F 11/3058; G06F 1/266; G01R 31/52; G01R 1/203; H04L 12/4625; H04L 12/40006; G01D 3/08
See application file for complete search history.

(56) References Cited

U.S. PATENT DOCUMENTS

| | | | |
|---|---|---|---|
| 8,462,473 | B2 | 6/2013 | Deval et al. |
| 8,724,279 | B2 | 5/2014 | Yang et al. |
| 2008/0025052 | A1 | 1/2008 | Yasumura |
| 2015/0123566 | A1* | 5/2015 | Tyson ............... H05B 45/397 315/294 |
| 2016/0025790 | A1 | 1/2016 | Forst et al. |
| 2016/0072269 | A1 | 3/2016 | Esschendal et al. |

FOREIGN PATENT DOCUMENTS

| | | |
|---|---|---|
| DE | 102013214726 A1 | 1/2015 |
| DE | 102015104275 A1 | 9/2016 |

OTHER PUBLICATIONS

UM1556 User Manual, VIPower M0-5 and M0-5Enhanced High-Side Drivers, Sep. 2013, retieved from www.st.com—87 pages.
Chinese Search Report for Chinese Application No. 2017800712811, dated Nov. 12, 2020, 1 page.

* cited by examiner

DEVICE FOR PROTECTING AN ELECTRONIC COMPUTER AGAINST A SHORT CIRCUIT

CROSS REFERENCE TO RELATED APPLICATIONS

This application is the U.S. National Phase Application of PCT International Application No. PCT/EP2017/053138, filed Nov. 16, 2017, which claims priority to French Patent Application No. 1661186, filed Nov. 18, 2016, the contents of such applications being incorporated by reference herein.

FIELD OF THE INVENTION

The present invention generally pertains to on-board electronic devices.

It relates more particularly to protecting the inputs of an electronic computer.

The invention is applicable in particular in the automotive industry. It may be implemented, for example, in an engine control computer.

BACKGROUND OF THE INVENTION

A motor vehicle nowadays includes an increasing amount of on-board electronics in order to manage various functions within the motor vehicle. These various functions are generally managed by electronic computers. A motor vehicle may thus include a plurality of electronic computers, such as for example an electronic computer dedicated to braking management, an electronic computer dedicated to passenger compartment management and an electronic computer dedicated to engine control management.

The engine control computer includes numerous electronic components, such as memories, microprocessors and signal converters, but also power electronics stages. A power electronics stage is also called an "output driver" and is designed to control loads, such as injectors, valves and electric motors, but also sensors.

With the increase in on-board functions, there are few or no pins available on the electronic computer, meaning that manufacturers and equipment suppliers have to consider new technological solutions in order to free up pins on said electronic computer.

FIG. 1 illustrates a voltage source sensor 2 (from the prior art) coupled for example to an engine control computer 4. The sensor 2 is for example a sensor dedicated to detecting the position of a camshaft of an internal combustion engine. Such a sensor 2 generally includes three pins, with a first sensor pin 2_1 coupled for example to a first computer pin 4_1, a second sensor pin 2_2 coupled to a second computer pin 4_2 dedicated to receiving a signal representative of the position of the camshaft, and lastly a third sensor pin 2_3 coupled to a third computer pin 4_3, which is generally coupled to an electrical ground of the motor vehicle. Despite good performance, the voltage source sensor 2 is being used increasingly less because it occupies three pins of the engine control computer 4.

FIG. 2 shows an example of a current source sensor 6 from the prior art. This sensor 6 operates and is coupled to the engine control computer 4 using only two pins. Thus, for performance identical to that of a voltage source sensor 2, one pin is freed up on the engine control computer 4, thus allowing an improvement in terms of wiring and in terms of connectors.

The current source sensor 6, also called two-wire sensor, is generally used for positioning of the crankshaft or positioning of the camshaft, and is in this case respectively called "crank" sensor or "CAM" sensor.

The current source sensor 6 delivers information in the form of a "current" rectangular-wave signal, requiring a more complex adaptation interface on the part of the engine control computer 4 in order to be able to detect close current levels (coming from the sensor 6). Specifically, it is necessary to detect low-value current thresholds, for example of around 10 mA. To this end, use is made of a "shunt" resistor 8.

Sizing the shunt resistor 8 is relatively complex. Specifically, its maximum value is determined such that the voltage across the terminals of the sensor 6 is still enough for said sensor to operate correctly (power supply for the sensor 6). Furthermore, its minimum value is determined so as to obtain sufficient detection accuracy for the current thresholds, corresponding to the difference between the minimum and maximum current value.

However, in the event of a short circuit at the battery voltage and regardless of the maximum and/or minimum value of the shunt resistor 8, it is necessary for said shunt resistor to support the power to be dissipated. For reasons of bulk but also cost, it is not possible to use a high-power shunt resistor 8, this requiring the installation of an active protective solution as illustrated in FIG. 2.

This active protection requires short-circuit detection and action for protecting the shunt resistor 8 by way of a microcontroller of the engine control computer 4. As is known to those skilled in the art, this active protection is based on a principle of the microprocessor monitoring the voltage level on the shunt resistor 8. Thus, when an overvoltage is detected across the terminals of the shunt resistor 8, the microcontroller activates another pin of the engine control computer 4 so as to isolate the shunt resistor 8 from the sensor 6 and above all so as to protect the engine control computer 4 from the short circuit.

Such a solution of monitoring the (current source) sensor 6 by way of the engine control computer 4 requires relatively extensive software resources. Specifically, it is necessary to create a routine corresponding to the program for monitoring that pin of the engine control computer 4 that is connected to the sensor 6. Furthermore, this routine exhibits a non-negligible reaction time upon a short circuit, for example of the order of 100 ms (1 ms=$10^{-3}$ s), which may sometimes lead to destruction of the engine control computer 4.

Thus, despite such a monitoring device, it is necessary to size the shunt resistor 8 taking into consideration the maximum heating admissible to the shunt resistor 8 during the reaction of the software routine upon a short circuit at the battery voltage. This condition with regard to the sizing of the shunt resistor 8 requires hardware resources that are relatively large, in particular in terms of the area occupied by the shunt resistor 8 on the electronic board of the engine control computer 4.

SUMMARY OF THE INVENTION

An aim of an aspect of the present invention is thus to provide a device for protecting an electronic computer against a short circuit independently of its operation, making it possible to improve protection thereof against said short circuit.

To this end, an aspect of the present invention proposes a device for protecting an electronic computer against a short circuit, the electronic computer comprising a first computer pin, a sensor comprising a first sensor pin and a second sensor pin, and a shunt resistor. According to an aspect of the present invention, the protection device furthermore includes a transistor driving module comprising a first driving pin coupled to a first shunt pin, a second driving pin coupled to a positive power supply, a second shunt pin being coupled firstly to a first sensor pin and secondly to a first comparator pin of a comparator module and
is designed to no longer supply electric power to the sensor when a short circuit is detected at the sensor.

The electronic computer is thus better protected from short circuits possibly originating from the sensor.

In one exemplary embodiment, the transistor driving module is a "high-side driver" integrated circuit for protecting the electronic computer against a battery short circuit, having a substantially improved reaction time in comparison with devices from the prior art.

As a variant, the transistor driving module is a "low-side driver" integrated circuit for protecting the electronic computer against a short circuit at the battery voltage.

To meet the requirements in terms of current in order for the sensor to operate correctly, use is for example made of at least one transistor.

To even further improve the detection sensitivity for a short circuit due to the proximity between the current levels at the terminals of the shunt resistor, it is for example proposed for the comparator module to furthermore include a comparator circuit designed to compare a voltage across the terminals of at least one pin of the shunt resistor.

For example, the comparator module is designed to deliver, on its second comparator pin, a first comparison threshold and a second comparison threshold that are at least 10 mV apart.

To improve protection of the engine control computer, it is proposed for example for the electric power supply for the sensor to be independent of the operation of a microcontroller of the electronic computer.

In a second aspect of the invention, what is proposed is an electronic computer having at least one device for protecting an electronic computer against a short circuit, such as proposed above.

BRIEF DESCRIPTION OF THE DRAWINGS

Details and advantages of aspects of the present invention will become more clearly apparent from the following description, given with reference to the appended schematic drawing, in which.

DETAILED DESCRIPTION OF THE PREFERRED EMBODIMENTS

For the sake of clarity in the description, only elements useful for understanding aspects of the invention will be presented in the text below.

Figure 1:
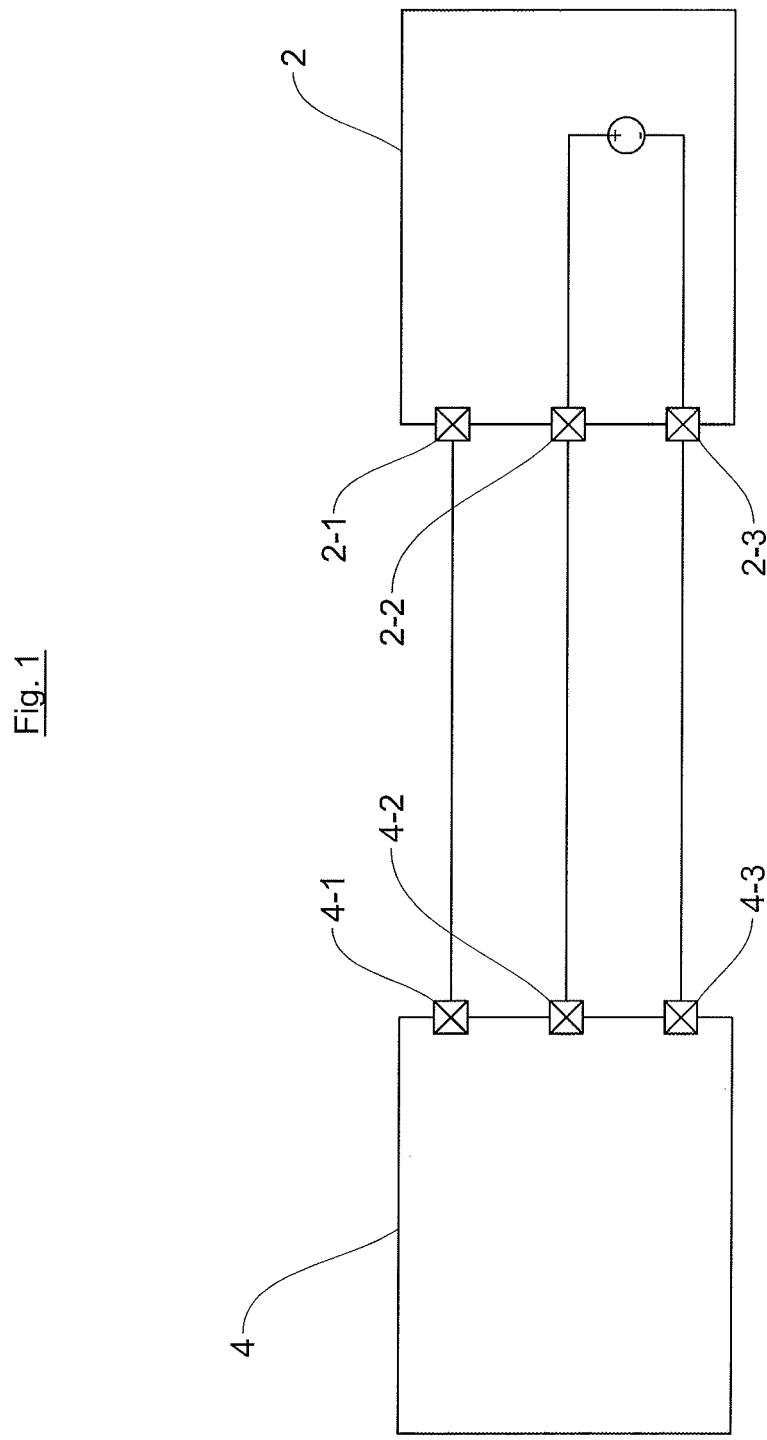
FIG. 1 is a partial circuit diagram of an engine control computer coupled to a voltage source sensor from the prior art.
Figure 2:
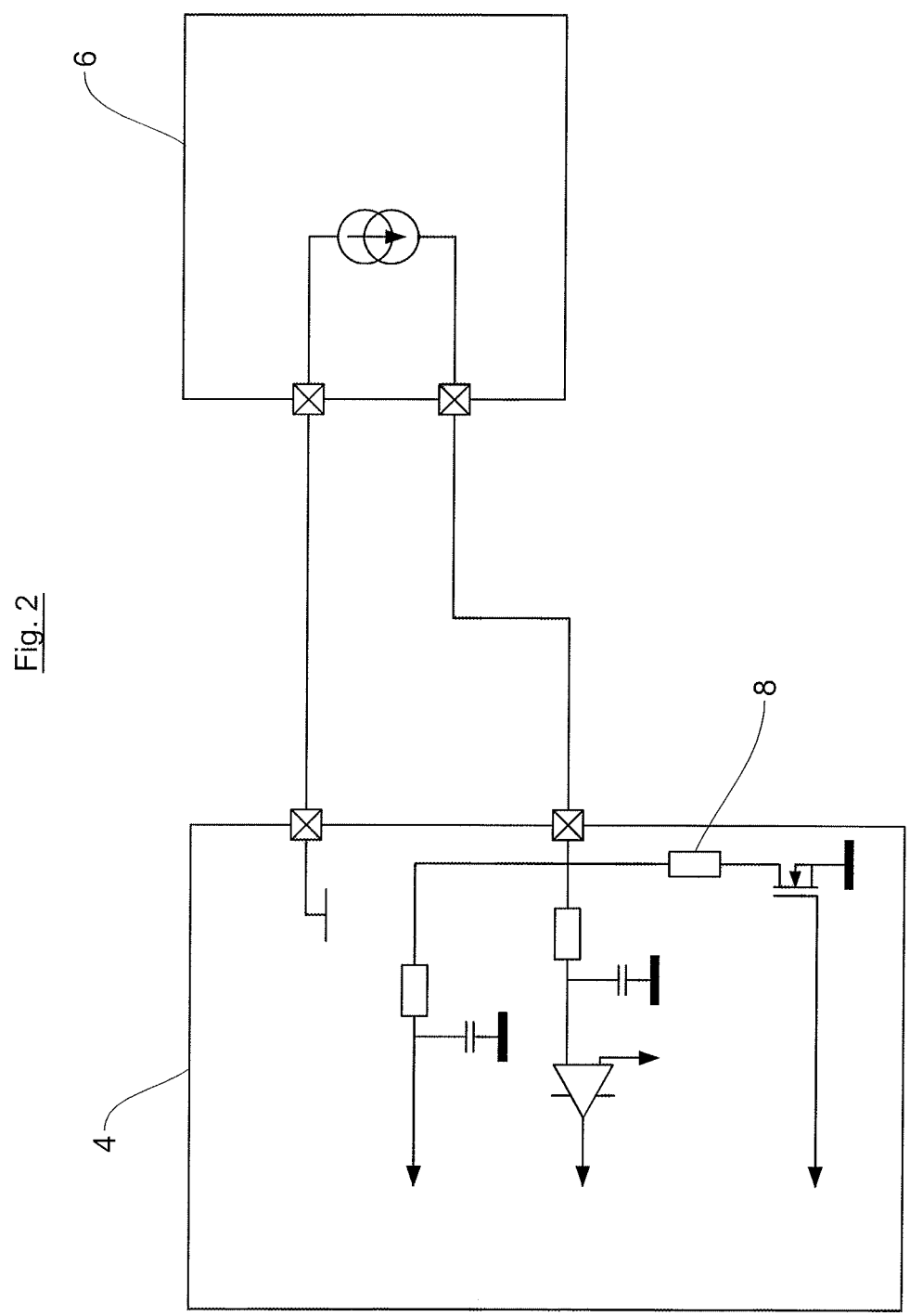
FIG. 2 is a partial circuit diagram of a solution for protecting an engine control computer coupled to a current source sensor from the prior art against a short circuit.
Figure 3:
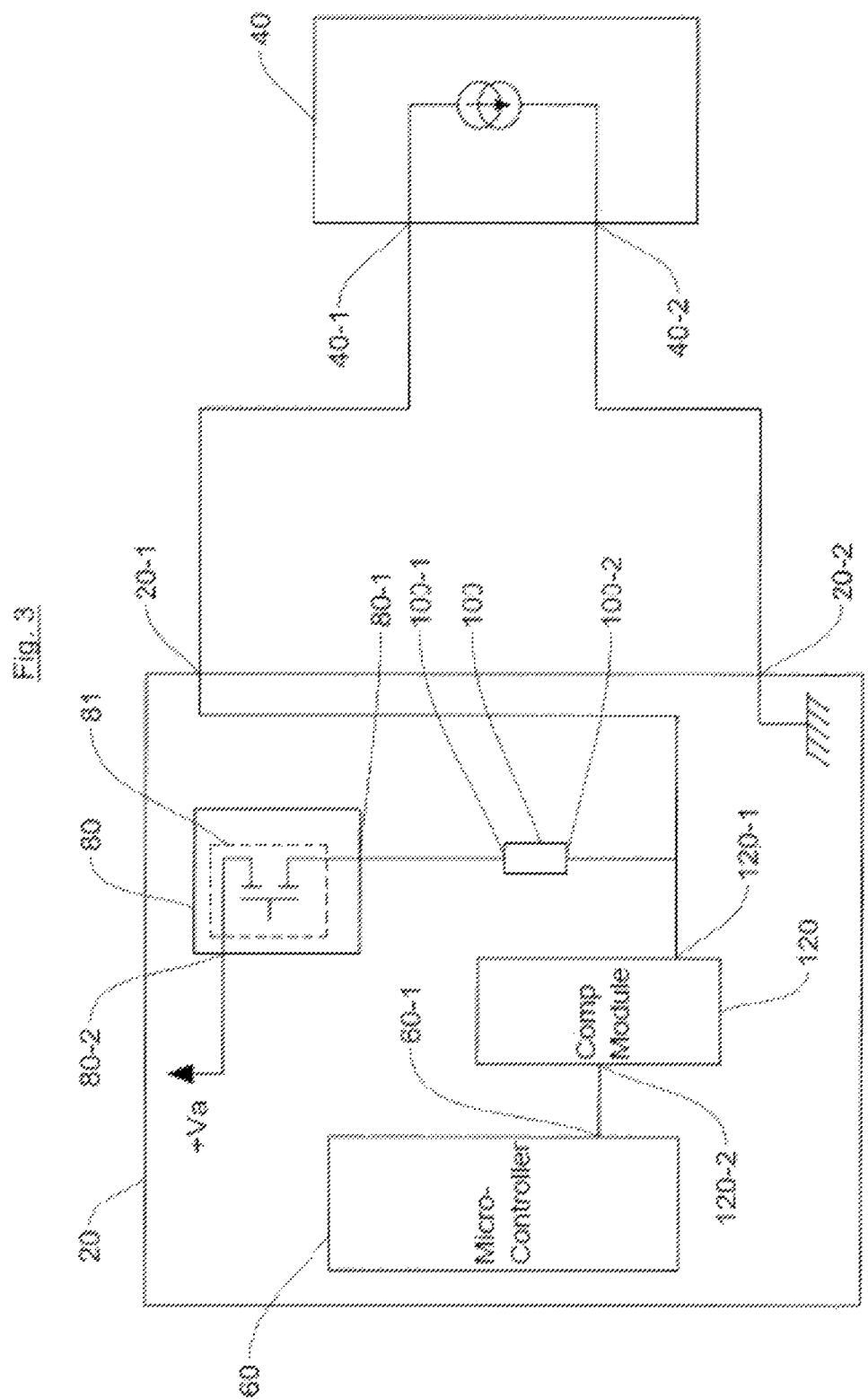
FIG. 3 is a partial circuit diagram of the protection device according to one exemplary embodiment of the invention.

FIG. 3 shows a partial circuit diagram of a computer, which may be an engine control computer 20, or also called ECU, from the acronym "engine control unit", by those skilled in the art, coupled to a sensor 40. The sensor 40 is for example a camshaft sensor or a crankshaft sensor. In one preferred embodiment of the invention, the sensor 40 is a current source sensor and includes only two wires or pins.

The sensor 40 has a first sensor pin 40_1 and a second sensor pin 40_2. For example, the sensor 40 is a magnetic sensor. The internal structure of such a sensor will not be described here, as it is well known to those skilled in the art. The sensor 40 delivers information in the form of a current through these two pins. Thus, for example, the signal delivered by the sensor 40 has a first current level and a second current level. The first current level has for example a value of 8 mA (1 mA=0.001 A) and the second current level has for example a value of 14 mA. These values are given purely by way of illustration and do not limit the scope of aspects of the invention.

The engine control computer 20 is installed for example in a motor vehicle having an internal combustion engine. The engine control computer 20 shown in FIG. 3 includes, inter alia, a first computer pin 20_1 and a second computer pin 20_2. The engine control computer 20 furthermore includes a microcontroller 60, a transistor driving module 80, a shunt resistor 100 and a comparator module 120.

To control the sensor 40, the first computer pin 20_1 is coupled to the first sensor pin 40_1 and the second computer pin 20_2 is coupled to the second sensor pin 40_2. Thus, by virtue of using a two-wire sensor such as presented here, but also by virtue of the device of an aspect of the invention, only two pins of the engine control computer 20 are used to control the sensor 40, reducing the requirements in terms of connector resources for the engine control computer 20.

The microcontroller 60 is for example a multicore microcontroller clocked at a frequency of the order of around a hundred megahertz. The microcontroller 60 has, inter alia, a first microcontroller pin 60_1. Of course, those skilled in the art will understand, upon reading the text, that only the pins useful for understanding and for the correct operation of an aspect of the invention are presented here. The first microcontroller pin 60_1 is for example an input dedicated to the acquisition of an electrical signal.

The transistor driving module 80 has a first driving pin 80_1 and a second driving pin 80_2. The first driving pin 80_1 is coupled to a first shunt pin 100_1 of the shunt resistor 100, and the second driving pin 80_2 is coupled to a positive power supply. For example, the positive power supply, called Va in FIG. 3, may be a voltage source delivering 5 volts.

In one exemplary embodiment of the invention, the transistor driving module 80 is an HSD driver, from the acronym "high-side driver". The transistor driving module 80 is better known to those skilled in the art under the name "HSD driver or HSD". In the exemplary embodiment presented here and illustrated in FIG. 3, the transistor driving module 80 is an HSD driver and advantageously makes it possible, in the case of a load connected to ground by default and upon a short circuit, to apply the positive supply voltage to the load, hence the name high-side driver. In the case of FIG. 3, the load is the sensor 40.

As the internal structure of such an HSD driver is well known to those skilled in the art, it will be presented only very briefly here. An HSD driver may be formed of discrete passive components or of transistors, but may also have a hybrid structure. In one exemplary embodiment, the internal structure of the transistor driving module 80 comprises a MOSFET transistor, from the acronym "metal-oxide-semiconductor field-effect transistor". This type of transistor is known to those skilled in the art for its abilities to channel currents that are easily able to cover the 100 mA range necessary to supply power to the sensor 40.

Advantageously, the transistor driving module 80, that is to say the HSD driver, also includes a function for automatically protecting against high currents. This function for automatically protecting an HSD driver is well known to those skilled in the art and makes it possible to "cut off" the current flowing through said driver when the value of the current is higher than an upper threshold value, for example. Advantageously, using the HSD driver to supply power to the sensor 40 makes it possible, on the one hand, to supply power to the sensor 40 with relatively high currents, and, on the other hand, makes it possible to protect the engine control computer 20 against a battery short circuit at the sensor 40.

As a variant, the transistor driving module 80 may be an LSD driver, from the acronym "low-side driver". It will be useful to use such a driver when the load is supplied with power by default at the positive supply voltage or battery voltage.

In the exemplary embodiment of FIG. 3, the transistor driving module 80 has at least one MOSFET transistor 81 having a gate 81_1, a source 81_2 and a drain 81_3. The source 81_2 is coupled to the second driving pin 80_2 and the drain 81_3 is coupled to the first driving pin 80_3 of the transistor driving module 80.

The shunt resistor 100 also has a second shunt pin 100_2 that is coupled firstly to the first computer pin 20_1 and secondly to a first comparator pin 120_1. The shunt resistor 100 is for example a resistor implemented using SMC technology, from the acronym "surface-mounted component". Advantageously, by virtue of the combination of the HSD driver and of the circuitry presented above, an aspect of the present invention makes it possible to size said shunt resistor 100 taking into consideration only the typical operating currents of the sensor 40, in contrast to a device from the prior art. It is thus no longer necessary to size the shunt resistor 100 taking into consideration a maximum current that may possibly flow when the sensor 40 is battery short-circuited.

Furthermore, by virtue of the rapid cut-off reaction time of the transistor driving module 80 in the event of a battery short circuit, the current flowing through the shunt resistor 100 does not manage to reach a high value. Thus, the power to be dissipated in the shunt resistor 100 is substantially less than that of a shunt resistor having a structure from the prior art. Advantageously, the area occupied by the shunt resistor 100 on an electronic board of the engine control computer 20 is substantially lower, and thus enables a reduction in the production cost. Furthermore, by virtue of the very rapid reaction time of the HSD driver, the engine control computer 20 is better protected against short circuits.

The second computer pin 20_2 is coupled to an electrical ground, which may be that of the battery of the motor vehicle, thus closing a current loop necessary for the sensor 40 to operate correctly.

The first comparator pin 120_1 is coupled firstly to the second shunt pin 100_2 and coupled secondly to the first computer pin 20_1. The comparator module 120 is designed to compare a voltage that is the image of the current flowing through the shunt resistor 100 with a reference threshold value. As mentioned above in the text of the description, the scenario is given in this exemplary embodiment that the sensor 40 delivers two current thresholds, with a lower first current threshold at 8 mA and an upper second current threshold at 14 mA.

To achieve optimum operation of the comparator module 120, the value of the reference voltage is determined so that it lies between the two current values of the sensor 40. Advantageously, by virtue of the comparator module 120, it is possible to generate, on a second comparator pin 120_2, a logic signal having a first comparison value and a second comparison value, which are respectively the images of the first current value and of the second current value flowing through the shunt resistor 100. In one exemplary embodiment, the first comparison value is equal to 0 V and the second comparison value is equal to 5 V. The second comparator pin 120_2 is coupled to the first microcontroller pin 60_1.

The internal structure of the comparator module 120 in order to meet such specifications is well known to those skilled in the art and will not be presented further here. In one variant embodiment, the internal structure of the comparator module 120 may be a differential structure, and the voltage value to be compared may be that present across the terminals of the shunt resistor 100.

By virtue of an aspect of the present invention and by virtue of the sensor 40 being supplied with power by the transistor driving module 80 through the shunt resistor 100, it is now possible, in the presence of a battery short circuit at the sensor 40, to cut the current supply for the sensor 40 and to electrically isolate it from the electronic computer 20 before informing the microcontroller 60 of this, independently of the operation of the microcontroller 60.

By virtue of the device of an aspect of the invention, the electronic computer 20 has better protection against short circuits on pins coupled to the sensor 40. Specifically, an aspect of the invention provides hardware protection independent of the operation of the microcontroller 60, thereby giving it a shorter reaction time than protection devices from the prior art in the presence of a battery short circuit of the sensor 40.

Advantageously, by virtue of this operational independence and of the sensor 40 being supplied with power by the transistor driving module 80, the engine control computer 20 has better protection against short circuits that may arise in an initialization or reset phase. Specifically, during an initialization phase of the engine control computer 20, the sensor 40 is supplied with power by the transistor driving module 80, independently of the initialization phase of the engine control computer 20. Thus, if a problem arises at the sensor 40, this problem will be immediately detected and, if necessary, the power supply for said sensor will be cut before the microcontroller 60 is informed of this after its initialization phase.

Furthermore, by virtue of an aspect of the invention, the shunt resistor 100 has a reduced area, since it is sized taking into consideration only the nominal operating currents of the sensor 40.

As a variant, the shunt resistor 100 and the transistor driving module 80 may be inverted.

In another embodiment, the device of an aspect of the invention is implemented in ASIC circuits into which the transistors are already integrated. These ASICs are generally integrated into the ECU.

As a variant, the transistor driving module 80 uses an HSD driver structure implemented in order to drive smart ignition coils.

In another variant, the various modules of the device of an aspect of the invention are partly or fully implemented in external electrical modules that are remote from the engine control computer 20.

Of course, aspects of the present invention are not limited to the preferred embodiment described above and illustrated in the drawing and to the variant embodiments mentioned, but extends to all variants within the scope of those skilled in the art.

The invention claimed is:

1. A device for protecting an electronic computer against a short circuit, the electronic computer comprising:
   a shunt resistor;
   a first computer pin coupled to a load comprising at least one sensor having a first sensor pin and a second sensor pin; and
   a transistor driving module comprising:
      a first driving pin coupled to a first shunt pin of the shunt resistor,
      a second driving pin coupled to a positive power supply, a second shunt pin of the shunt resistor being coupled firstly to the first sensor pin and secondly to a first comparator pin of a comparator module, and
      a transistor for supplying electric power to the at least one sensor through the first sensor pin,
   wherein the transistor driving module is designed to perform the following steps independent of an operation of the electronic computer:
      detect when a current flowing through the at least one sensor reaches a threshold current, the threshold current being less than a short circuit current of the positive power supply, and
      in response to the detected current reaching the threshold current, control the transistor to stop supplying the electric power to the at least one sensor through the first sensor pin, and
   wherein an electrical current rating of the shunt resistor is designed based on a normal operating current drawn by the at least one sensor which is less than the short circuit current of the positive power supply.

2. The device for protecting an electronic computer against a short circuit as claimed in claim 1, wherein the transistor driving module is a "high-side driver" integrated circuit.

3. The device for protecting an electronic computer against a short circuit as claimed in claim 1, wherein the transistor driving module is a "low-side driver" integrated circuit.

4. The device for protecting an electronic computer against a short circuit as claimed claim 1, wherein the device includes at least one transistor.

5. The device for protecting an electronic computer against a short circuit as claimed in claim 1, wherein the comparator module furthermore includes a comparator circuit designed to compare a voltage across the terminals of at least one pin of the shunt resistor.

6. The device for protecting an electronic computer against a short circuit as claimed in claim 5, wherein the comparator module is designed to deliver, on its second comparator pin, a first comparison threshold and a second comparison threshold that are at least 10 mV apart.

7. The device for protecting an electronic computer against a short circuit as claimed in claim 1, wherein the electric power supply for the sensor is independent of the operation of a microcontroller of the electronic computer.

8. An electronic computer, comprising at least one device for protecting the electronic computer against a short circuit as claimed in claim 1.

* * * * *